United States Patent [19]

Yukihiro

[11] Patent Number: 5,331,195
[45] Date of Patent: Jul. 19, 1994

[54] FUSE CONSTRUCTION OF A SEMICONDUCTOR DEVICE

[75] Inventor: Okeda Yukihiro, Sagamihara, Japan

[73] Assignee: Nippon Steel Corporation, Tokyo, Japan

[21] Appl. No.: 901,068

[22] Filed: Jun. 19, 1992

[30] Foreign Application Priority Data

Jun. 21, 1991 [JP] Japan .................................. 3-177317

[51] Int. Cl.⁵ ............................................. H01L 27/02
[52] U.S. Cl. ...................................... 257/529; 257/665
[58] Field of Search ................................ 257/529, 665

[56] References Cited

U.S. PATENT DOCUMENTS 4,689,550  8/1987  Ujihara et al. ...................... 257/525

FOREIGN PATENT DOCUMENTS 57-72367   5/1982  Japan .
1-158764  12/1989  Japan .................................. 257/529
3-29344    2/1991  Japan .................................. 257/665

OTHER PUBLICATIONS

J. A. Yasaitis et al., "Low Resistance Laser Formed Lateral Links", *IEEE Electron Device Letters*, EDL-3, No. 7 (Jul. 1982) pp. 184–186.

*Primary Examiner*—J. Carroll
*Attorney, Agent, or Firm*—Cushman, Darby & Cushman

[57] ABSTRACT

At least one fusing electrode charging electrode portion is connected to an intermediate portion of a fuse body of a fuse that has the fuse body and connecting end electrode portions provided at both ends thereof. A fusing voltage for fusing the fuse is charged through this fusing voltage charging electrode portion. It allows the concentration of a current at a specific portion of the fuse body to assure fusing of the fuse body at the specified portion. In addition, it is not necessary to increase the overall resistance of the fuse, no problem will arise even when the fuse, and is used in the circuit.

15 Claims, 3 Drawing Sheets

FUSE CONSTRUCTION OF A SEMICONDUCTOR DEVICE

BACKGROUND OF THE INVENTION

1. Field of the Invention

The present invention relates to a fuse structure incorporated in an internal wiring of a semiconductor device and cut as required for modifying a circuit pattern of the semiconductor device.

2. Description of the Related Art

A semiconductor device provided with a fuse and a fuse structure therefor are disclosed in Japanese Unexamined Patent Publication (Kokai) No. 57-72368.

The fuse in the semiconductor device is typically formed of a polycrystalline silicon and have a planar configuration as illustrated in FIG. 5, for example. Namely, the fuse has a relatively elongated fuse body 110 and connecting end electrode portions 112 and 114 integrally formed at both ends of the fuse body 110. Respective of the connecting end electrode portions 112 and 114 are connected to internal aluminum wirings of the semiconductor device, for example.

For cutting the fuse, two ways are typically used. One is the method employing a laser beam, in which the laser beam is irradiated at the fuse body 110 of the fuse to be cut to fuse the fuse body 110 by the laser beam. The other method is to charge a high fusing voltage between the connecting end electrode portions 112 and 114 at both ends of the fuse for electrically fusing the fuse body 110 by heating through a resistance heating.

The fuse incorporated in the internal wiring of the semiconductor device is covered with a passivation layer. Either in case of fusing the fuse employing the laser beam or in case of fusing the fuse electrically, an opening 115 is frequently formed in the passivation layer at the portion corresponding to the fuse body 110 for discharging the vaporized silicon.

When the fuse is to be molten electrically by resistance heating, the high fusing voltage is applied to the connecting end electrode portions 112 and 114 at both ends of the fuse to be molten, as set forth above. However, since the fuse is also connected to other circuit portions of the semiconductor device, the voltage to be charged is limited. The limit of the voltage to be charged is normally 10~15V. Therefore, in the conventional structure of the fuse, the fuse body 110 is not sufficient and cannot assure fusing thereof.

As a solution to this, it is considered making the fuse body 110 thinner to increase the resistance thereof. However, when the fuse remains conductive without cutting, a current may constantly flow therethrough during normal use of the semiconductor device to cause fusing of the fuse during operation of the semiconductor device if the fuse is excessively thin. Therefore, there is also a limit in thinning the fuse.

Therefore, it is an object of the present invention to provide a fuse structure for a semiconductor device that can be molten electrically by resistance heating.

SUMMARY OF THE INVENTION

In order to accomplish the above-mentioned object, a fuse structure for a semiconductor device, according to the present invention, which includes a fuse body portion incorporated in an internal wiring of the semiconductor device and connecting end electrode portions provided at both ends of the fuse body, characterized by at least one fusing voltage charging electrode provided in the fuse body for charging a fusing current for fusing the fuse by resistance heating. On the other hand, the fuse body is formed with mutually separated two thin width lines connecting the connecting end electrode portions at both ends, and at least one of the thin width lines is provided with at least one fusing voltage charging electrode portion. Also, the fuse body may be formed with mutually separated three thin lines connecting the connecting end electrode portions at both ends, and at least the two outer lines among the thin width lines are provided with at least one fusing voltage charging electrode portion. Furthermore, a fuse structure to be incorporated in an internal wiring of a semiconductor device, according to the present invention, comprises a fuse body, first electrodes provided at both ends of the fuse body for connecting the fuse body with other circuit systems, a second electrode connected to the fuse body independently of the first electrode and charging fusing voltage for fusing the fuse body by resistance heating. The length of the fuse body placed between the second electrodes is shorter than the length of the fuse body placed between the first electrodes. The fuse body includes a polycrystalline silicon in a material thereof. The fuse body is formed with a plurality of mutually separated thin width lines connected between the first electrodes. At least one second electrode is connected to at least one of the thin width lines.

With the present invention constructed as set forth above, it is possible to fuse the fuse incorporated in the internal wiring of the semiconductor device by electrical resistance heating for the purpose of modification of the circuit pattern depending upon necessity after fabrication of the semiconductor device. In addition, since it is not necessary to increase the resistance value of the overall fuse, no problem will arise even when the fuse is used without fusing.

DESCRIPTION OF THE PREFERRED EMBODIMENT

Figure 1:
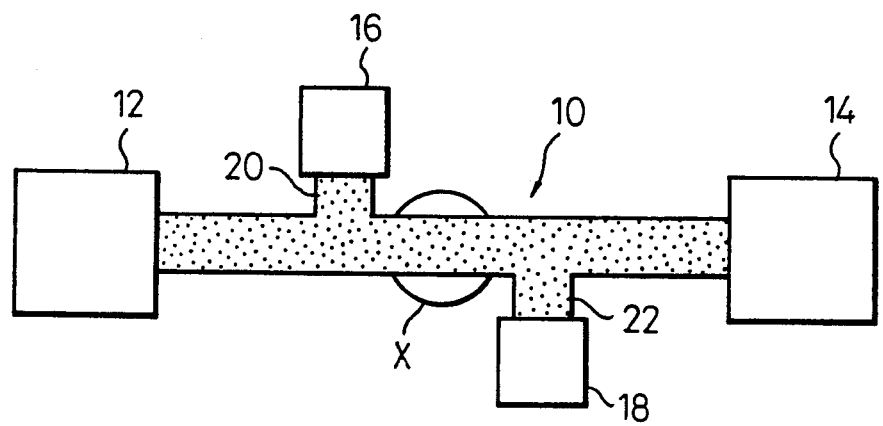
FIG. 1 is a fragmentary plan view showing the first embodiment of the invention.

The preferred embodiments of the present invention will be discussed herebelow with reference to the accompanying drawings;

FIG. 1 is a fragmentary plan view showing a planar configuration of the first embodiment of a fuse according to the present invention. The fuse has a fuse body 10 and connecting end electrode portions (first electrode) 12 and 14 for connecting other circuit system or wirings in the semiconductor device. For the fuse body 10, a pair of fusing voltage charging electrode portions (second electrode) 16, 18 formed of the same material to the fuse body 10 are further connected through extraction conductors 20 and 22, as further shown). This fuse is formed with a polycrystalline silicon integrally with the fuse body 10, the connecting end electrode portions 12 and 14, the fusing voltage charging electrode portions 16 and 18, and extraction conductors 20 and 22.

Figure 5:
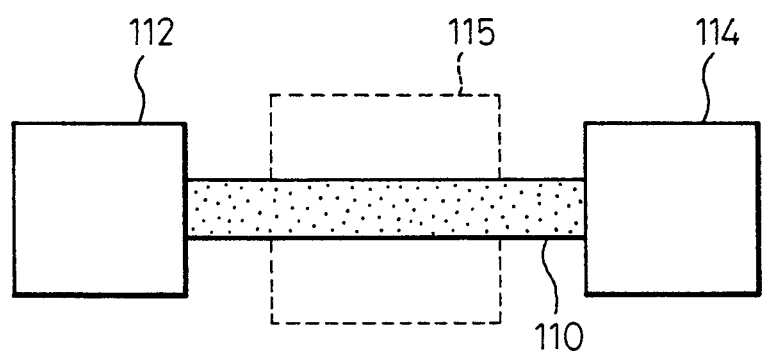
FIG. 5 is a fragmentary plan view showing one example of the conventional fuse structure.

When the fuse shown in FIG. 1 is cut, a predetermined fusing voltage is charged between a pair of fusing voltage charging electrode portions 16 and 18. Then, a current is concentrated at a partial region X of the fuse body 10 between the fusing voltage charging electrode portions 16 and 18 so that this partial region is heated to a molten state. With this construction, the heating portion can be shortened in comparison with the conventional construction such as shown in FIG. 5 to assure fusing of the fuse by expanding a period for charging the voltage, for example.

It should be noted, it is not necessary to provide two fusing voltage charging electrode portions as in the shown embodiment and can be one. When one fusing voltage charging electrode portion is provided, the fusing voltage is charged between the one fusing voltage charging electrode portion and either one of the connecting electrode portions 12 and 14 to fuse the fuse therebetween. However, by symmetrically providing two fusing voltage charging electrode portions around the center portion of the fuse body 10 as in the shown embodiment, it becomes possible to concentrate the current at the central portion X of the fuse body 10 to cause fusing. Also, since the resistance value of the fuse is not very high, no problem will arise when the fuse is maintained for use as a conductor or a resistor, since it will never fuse during use.

Figure 2:
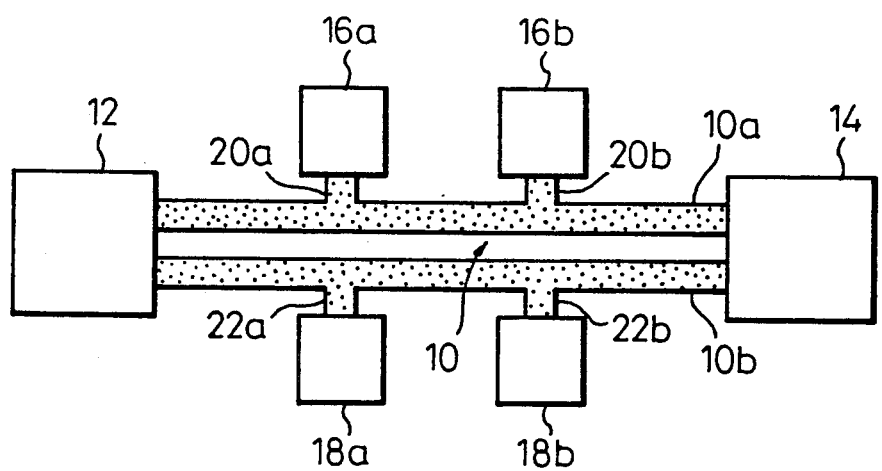
FIG. 2 is a fragmentary plan view showing the second embodiment of the invention.

FIG. 2 is a fragmentary plan view showing the planar configuration of the second embodiment of the fuse according to the invention. In this embodiment, as shown, the fuse body 10 is separated into thin width lines 10a and 10b. For respective thin width lines 10a and 10b, respective pairs of fusing voltage charging electrodes 16a, 16b and 18a, 18b are connected through the extraction conductors 20a, 20b and 22a, 22b. With such a construction, the resistance at respective thin width lines 10a and 10b becomes twice that of the resistance of the conventional fuse body 10. Therefore, the amount of heat to be generated when the fusing voltage is charged between the fusing voltage charging electrode portions 16a, 16b and 18a, 18b, is increased so as to cause fusing. Although the foregoing embodiment forms the fuse of the polycrystalline silicon, the material is not limited to the polycrystalline silicon but can be amorphous silicon, metal silicide.

Figure 3:
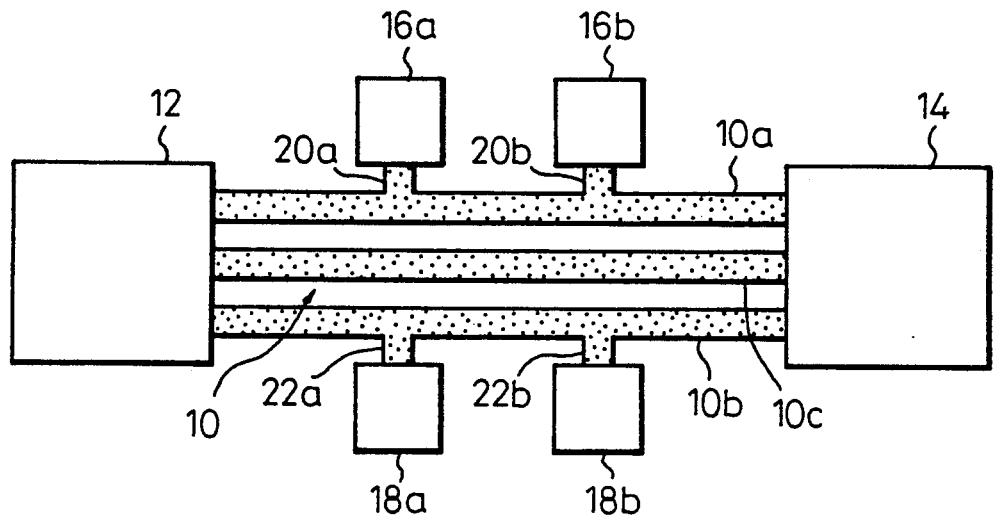
FIG. 3 is a fragmentary plan view showing the third embodiment of the invention.
Figure 4:
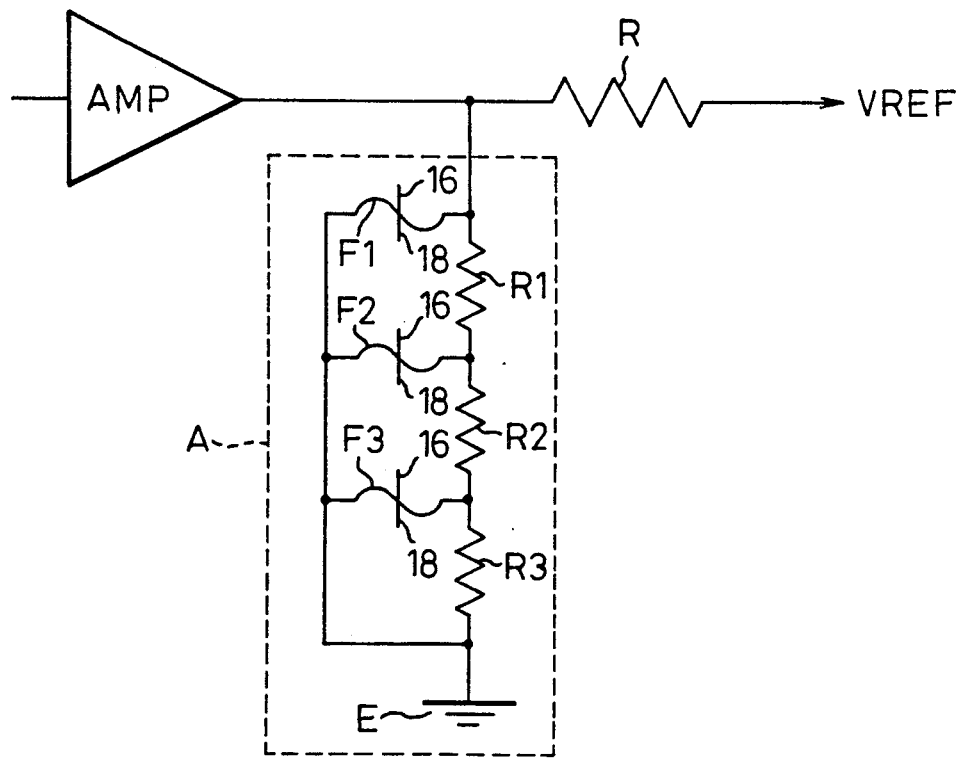
FIG. 4 is a circuit diagram showing a redundant circuit provided in an internal reference voltage circuit of the semiconductor device.

On the other hand, the fuse having the construction as shown in FIGS. 1, 2 and 3, can be used in the following application. For example, in an internal reference voltage circuit for outputting a reference voltage $V_{ref}$ of an analog IC, a resistance trimming technology is employed for precisely controlling the output level using the fuse. As shown in FIG. 4, in a final output means of the internal reference voltage circuit, a kind of redundant circuit A formed by resistors $R_1$, $R_2$, $R_3$ and fuses $F_1$, $F_2$ and $F_3$ is provided in addition to a resistor R providing a reference. Such redundant circuit A is preliminarily incorporated in the internal wiring of the semiconductor device. When an error in an output reference voltage $V_{ref}$ is detected as a result of the measurement, an appropriate fuse among the fuses $F_1$, $F_2$ and $F_3$ is fused through resistance heating by applying the voltage to the corresponding fusing voltage charging electrode portions 16 and 18 to control the output reference voltage $V_{ref}$ at a proper value. Such control enables, the employment of a fuse having a construction including the fusing voltage charging electrode portions 16 and 18 as shown in FIGS. 1, 2 and 3, instead of the fuses $F_1$, $F_2$ and $F_3$.

I claim:

1. A fuse structure for a semiconductor device that includes a fuse body incorporated in an internal wiring of the semiconductor device and connecting end electrode portions provided at both ends of the fuse body, said fuse structure having at least one fusing voltage charging electrode provided in said fuse body and between said end electrode portions to drive a fusing current for fusing said fuse body by resistance heating.

2. A fuse structure for a semiconductor device as set forth in claim 1, wherein said fuse body is formed with mutually separated two thin width lines connecting said connecting end electrode portions at both ends, and at least one of said thin width lines is provided with at least one fusing voltage charging electrode portion.

3. A fuse structure for a semiconductor device as set forth in claim 1, wherein said fuse body is formed with mutually separated three thin width lines connecting said connecting end electrode portions at both ends, and at least the two outer lines among said thin width lines are provided with at least one fusing voltage charging electrode portion.

4. A fuse structure to be incorporated in an internal wiring of a semiconductor device, comprising:
   a fuse body:
   first electrodes provided at both ends of said fuse body for connecting said fuse body with other circuit systems; and
   at least one second electrode connected to said fuse body independently of said first electrodes for providing thereto a fusing voltage to fuse the fuse body by resistance heating.

5. A fuse structure for a semiconductor device as set forth in claim 4, wherein the length of said fuse body placed between said at least one second electrode and one of said first electrodes, or between two of said second electrodes when at least two of said second electrodes are provided along said fuse body, is shorter than the length of said fuse body placed between said first electrodes.

6. A fuse structure for a semiconductor device as set forth in claim 4, wherein said fuse body includes a polycrystalline silicon in a material thereof.

7. A fuse structure for a semiconductor device as set forth in claim 4, wherein said fuse body is formed with a plurality of mutually separated thin width lines connected between said first electrodes.

8. A fuse structure for a semiconductor device as set forth in claim 7, wherein at least one second electrode is connected to at least one of said thin width lines.

9. A fuse structure for a semiconductor device including at least one charging electrode connected along a fusible electrical path capable of being melt-cut anywhere along its length, this length being defined by the distance between adjacent end electrodes, said adjacent end electrodes also being connected to the fusible electrical path at respective first and second ends thereof, said at least one charging electrode receiving a fusing voltage during a fusing operation and no voltage during a non-fusing or normal operation,
   said fusible electrical path being adapted to be melt-cut along a predetermined portion of the fusible electrical path when a fusing current is applied to said at least one charging electrode, wherein the fusible electrical path is of sufficient resistance to prevent it from being melt-cut during normal operation, and wherein the predetermined fusing intensity of the fusing voltage is set sufficiently high to create a melt-cut in the fusible electrical path but not so high as to damage circuit elements connected across the adjacent end electrodes.

10. The fuse structure of claim 9, wherein said fusible electrical path is formed having two mutually separated thin width lines connected between said adjacent end electrodes, said at least one charging electrode being coupled to at least one of said thin width lines.

11. The fuse structure of claim 9, wherein said fusible electrical path is formed having three mutually separated thin width lines connected between said adjacent end electrodes, at least two of said thin width lines being coupled to corresponding ones of said at least one charging electrode.

12. The fuse structure of claim 9, wherein said fusible electrical path is formed from a polycrystalline silicon material.

13. The fuse structure of claim 9, wherein said fusible electrical path is formed having a plurality of mutually separated thin width lines connected between said adjacent end electrodes, said at least one charging electrode being coupled to at least one of said plurality of thin width lines.

14. The fuse structure of claim 9, wherein said at least one charging electrode includes a single charging electrode connected to said fusible electrical path so as to receive the fusing voltage across said single charging electrode and one of said adjacent electrodes, said one adjacent electrode being connected on the first end of said fusible electrical path and the other of said adjacent electrodes being connected at the second end of said fusible electrical path, the fusing voltage causing a melt-cut at the predetermined portion of the fusible electrical path located between said single charging electrode and said first end.

15. The fuse structure of claim 9, wherein said at least one charging electrode includes two charging electrodes connected to said fusible electrical path so as to receive the fusing voltage thereacross, the fusing voltage causing a melt-cut at the predetermined portion of the fusible electrical path located between said two charging electrodes, as well as between the first and second ends of said fusible electrical path corresponding respectively to the position of each of said adjacent electrodes.

* * * * *